United States Patent
Jang et al.

(10) Patent No.: US 12,451,863 B2
(45) Date of Patent: Oct. 21, 2025

(54) BULK ACOUSTIC WAVE RESONATOR AND METHOD OF MANUFACTURING BULK ACOUSTIC WAVE RESONATOR

(71) Applicant: WISOL CO., LTD., Gyeonggi-do (KR)

(72) Inventors: Jin Nyoung Jang, Gyeonggi-do (KR); Kang Ho Kim, Gyeonggi-do (KR); Yun Sik Choi, Gyeonggi-do (KR); Joon Sung Kwon, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 737 days.

(21) Appl. No.: 17/888,633

(22) Filed: Aug. 16, 2022

(65) Prior Publication Data
US 2023/0075102 A1  Mar. 9, 2023

(30) Foreign Application Priority Data

Aug. 19, 2021 (KR) .................. 10-2021-0109434

(51) Int. Cl.
  *H03H 9/17* (2006.01)
  *H03H 3/02* (2006.01)
  *H03H 9/13* (2006.01)

(52) U.S. Cl.
  CPC .......... *H03H 9/17* (2013.01); *H03H 3/02* (2013.01); *H03H 9/131* (2013.01)

(58) Field of Classification Search
  CPC .......... H03H 9/17; H03H 3/02; H03H 9/131; H03H 9/02015; H03H 9/171; H03H 3/007; H03H 9/178; H03H 2003/0071
  See application file for complete search history.

(56) References Cited

U.S. PATENT DOCUMENTS

| | | | |
|---|---|---|---|
| 6,933,809 B2 * | 8/2005 | Kyoung | H03H 9/562 333/187 |
| 9,243,316 B2 * | 1/2016 | Larson, III | C23C 14/228 |
| 9,847,768 B2 * | 12/2017 | Grannen | C30B 29/406 |
| 11,949,401 B2 * | 4/2024 | Jang | H03H 9/0514 |
| 11,967,940 B2 * | 4/2024 | Burak | H03H 9/174 |
| 2011/0121689 A1 * | 5/2011 | Grannen | C30B 23/02 29/25.35 |

(Continued)

FOREIGN PATENT DOCUMENTS

| | | |
|---|---|---|
| CN | 119767781 A * 4/2025 | |
| DE | 112008002199 B4 * 10/2021 | ............. H03H 9/172 |

(Continued)

OTHER PUBLICATIONS

Office Action from corresponding Korean Patent Application No. 10-2021-0109434, dated Oct. 25, 2023.

*Primary Examiner* — Pedro J Cuevas
(74) *Attorney, Agent, or Firm* — Harness, Dickey & Pierce, P.L.C.

(57) ABSTRACT

A method of manufacturing a bulk acoustic wave (BAW) resonator according to an embodiment of the present invention may include: forming a lower electrode above a substrate; forming a nitrogen layer on an upper surface of the lower electrode through nitrogen ($N_2$) plasma surface treatment; forming a piezoelectric layer made of an AlScN material above the nitrogen layer to align an upper surface of the piezoelectric layer to an N polarity; and forming an upper electrode above the piezoelectric layer aligned to the N polarity.

16 Claims, 7 Drawing Sheets

(56) References Cited

U.S. PATENT DOCUMENTS

| | | | |
|---|---|---|---|
| 2011/0180391 A1* | 7/2011 | Larson, III | C23C 14/02 204/192.18 |
| 2014/0132117 A1 | 5/2014 | Larson, III | |
| 2022/0038072 A1* | 2/2022 | Jang | H03H 9/0514 |
| 2022/0140806 A1* | 5/2022 | Burak | H03H 9/02118 333/187 |
| 2023/0108824 A1* | 4/2023 | Bader | H03H 3/04 310/360 |
| 2023/0109080 A1* | 4/2023 | Bader | H03H 9/02015 310/360 |
| 2023/0109569 A1* | 4/2023 | Bader | H03H 9/706 310/360 |
| 2023/0170876 A1* | 6/2023 | Burak | H03H 9/17 331/154 |
| 2023/0216476 A1* | 7/2023 | Burak | H03H 9/13 331/154 |
| 2023/0246629 A1* | 8/2023 | Burak | H03H 9/15 343/720 |
| 2023/0271320 A1* | 8/2023 | Dayeh | H10D 48/50 700/260 |

FOREIGN PATENT DOCUMENTS

| | | | | |
|---|---|---|---|---|
| JP | 2007129391 A | * | 5/2007 | H03H 9/02125 |
| JP | 4784815 B2 | * | 10/2011 | |
| KR | 20100068366 A | * | 6/2010 | H03H 3/02 |
| KR | 10-2019-0004627 A | | 1/2019 | |
| KR | 10-2019-0019813 A | | 2/2019 | |
| KR | 10-2028719 B1 | | 10/2019 | |
| WO | WO-2022035659 A1 | * | 2/2022 | G01L 1/16 |
| WO | WO-2023168139 A2 | * | 9/2023 | H10D 62/854 |

\* cited by examiner

BULK ACOUSTIC WAVE RESONATOR AND METHOD OF MANUFACTURING BULK ACOUSTIC WAVE RESONATOR

CROSS-REFERENCE TO RELATED APPLICATION

This application claims priority to Korean Patent Application No. 10-2021-0109434 filed on Aug. 19, 2021 in the Korean Intellectual Property Office, and all the benefits accruing therefrom under 35 U.S.C. 119, the contents of which in its entirety are herein incorporated by reference.

TECHNICAL FIELD

The present disclosure relates to a resonator for use in a filter, a duplexer, or the like for communication in the ratio frequency (RF) band, and more particularly, to a bulk acoustic wave (BAW) resonator including a film bulk acoustic resonator (FBAR) or a solidly mounted resonator (SMR) and a method of manufacturing a BAW resonator.

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (SAW) filter are used most as an RF filter for wireless communication. The dielectric filter has advantages such as a high dielectric constant, a low insertion loss, stability at a high temperature, high vibration resistance, and high shock resistance. However, the dielectric filter has limitations in miniaturization and monolithic microwave integrated circuit (MMIC) which are recent trends of technology development. Also, an SAW filter has a small size in comparison to the dielectric filter, easily processes a signal, has a simple circuit, and is manufactured using a semiconductor process so as to facilitate mass production. Also, the SAW filter has an advantage of transmitting and receiving high-grade information due to higher side rejection within a passband in comparison to the dielectric filter. However, since an SAW filtering process includes an exposure process using ultraviolet (UV), there is a disadvantage in which a line width of an interdigital transducer (IDT) has a limitation of about 0.5 µm. Accordingly, there is a problem in which it is impossible to cover an ultrahigh frequency band of 5 GHz or more using the SAW filter. Basically, there is a difficulty in forming an MMIC structure and a single chip on a semiconductor substrate.

In order to overcome the above limitations and problems, a film bulk acoustic resonator (FBAR) filter integrated with other active devices on an existing semiconductor (Si or GaAs) substrate to completely implement a frequency control circuit as an MMIC is provided.

The FBAR is a thin film device which is low-cost, small-sized, and features high quality coefficient so as to be applicable to a wireless communication device, a military-use radar in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, it is apparent that the FBAR is most adequate device for an MMIC which requires high stability and a high quality coefficient.

An FBAR filter is formed by depositing zinc oxide (ZnO), aluminum nitride (AlN), or the like which is a piezoelectric-dielectric material on silicon (Si) or gallium arsenide (GaAs) which is a semiconductor substrate using an RF sputtering method and causes resonation due to a piezoelectric property. That is, the FBAR generates resonance by depositing a piezoelectric film between both electrodes and causing a bulk acoustic wave.

A variety of forms of FBAR structures have been studied until now. In the case of a membrane type FBAR, a silicon oxide film ($SiO_2$) is deposited on a substrate and a membrane layer is formed using a cavity formed through isotropic etching on an opposite side of the substrate. Also, a lower electrode is formed above the silicon oxide film, a piezoelectric layer is formed by depositing a piezoelectric material above the lower electrode using an RF magnetron sputtering, and an upper electrode is formed above the piezoelectric layer.

The above membrane type FBAR has an advantage of less dielectric loss and power loss due to the cavity. However, the membrane type FBAR has problems in which an area occupied by a device is large due to a directivity of the silicon substrate and a yield is decreased by damages due to low structural stability in a follow-up packaging process. Accordingly, recently, in order to reduce a loss caused by the membrane and to simplify a device manufacturing process, an air-gap type FBAR and a Bragg reflector type FBAR, i.e., solidly mounted resonators (SMRs) have appeared.

The SMR has a structure in which a reflection layer is formed by depositing materials having a high elastic impedance difference on every other layer on a substrate and a lower electrode, a piezoelectric layer, and an upper electrode are sequentially deposited. Here, elastic wave energy which has passed through the piezoelectric layer is not transferred toward the substrate and all reflected by the reflection layer so as to generate efficient resonation. Although the SMR is structurally firm and has no stress caused by bending, it is difficult to form four or more reflection layers having a precise thickness for total reflection and significant amounts of time and cost are necessary for manufacturing.

Meanwhile, in an existing air-gap type FBAR having a structure that uses an air gap instead of the reflection layer to isolate a substrate and a resonance portion, a sacrificial layer is implemented by performing isotropic etching on a surface of a silicon substrate and is surface-polished through chemical-mechanical polishing, an insulation layer, a lower electrode, a piezoelectric layer, and an upper electrode are sequentially deposited, and an air gap is formed by removing the sacrificial layer through a via hole so as to implement an FBAR. In general, a piezoelectric layer is formed between upper and lower electrodes in an FBAR structure, and the upper and lower electrodes are installed in only a necessary area so as to use a piezoelectric effect.

In the existing BAW resonator structure, aluminum nitride (AlN) or AlN doped with scandium (Sc) or the like is used as the material of the piezoelectric layer. The reason of doping with scandium is to obtain a wide bandwidth at high frequencies and thus to improve an effective electromechanical coupling coefficient ($k^2_{eff}$).

However, when aluminum nitride (AlN) is excessively doped with a higher concentration of scandium (Sc), $k^2_{eff}$ and quality coefficient values are rather reduced due to abnormal growth of an AlScN material. In order to suppress such abnormal growth, a compressive stress process may be applied, but the application of compressive stress may cause stiction in the FBAR structure.

PRIOR ART LITERATURES

Patent Literature (Patent Literature 0001) Korean Patent Registration No. 10-2028719 (Published on Oct. 7, 2019)

SUMMARY

Aspects of the present disclosure provide a method of manufacturing a bulk acoustic wave (BAW) resonator capable of suppressing abnormal growth of an AlScN material constituting a piezoelectric layer during manufacture of a BAW resonator including a film bulk acoustic resonator (FBAR) or a solidly mounted resonator (SMR).

In one general aspect, there is provided a method of manufacturing a BAW resonator including: forming a lower electrode above a substrate; forming a nitrogen layer on an upper surface of the lower electrode through nitrogen ($N_2$) plasma surface treatment; forming a piezoelectric layer made of an AlScN material above the nitrogen layer to align an upper surface of the piezoelectric layer to an N polarity; and forming an upper electrode above the piezoelectric layer aligned to the N polarity.

The method may further include, after forming the lower electrode, removing contaminants from the upper surface of the lower electrode through argon (Ar) plasma surface treatment on the lower electrode.

The method may further include, after forming the nitrogen layer, cooling a high-temperature state due to the argon plasma surface treatment and formation of the nitrogen layer to a predetermined temperature or less.

The predetermined temperature or a deposition process temperature of the AlScN material may be 280[° C.] or more and 320[° C.] or less.

In the piezoelectric layer, a composition ratio of the AlScN material may be $Al_{1-X}Sc_XN$, and X may be 0.05 or more and 0.43 or less.

In another general aspect, there is provided a method of manufacturing a BAW resonator including: forming a lower electrode above a substrate; forming an aluminum layer on an upper surface of the lower electrode; forming a piezoelectric layer made of an AlScN material above the aluminum layer to align an upper surface of the piezoelectric layer to an Al polarity; and forming an upper electrode above the piezoelectric layer aligned to the Al polarity.

The method may further include, after forming the lower electrode, removing contaminants from the upper surface of the lower electrode through argon (Ar) plasma surface treatment on the lower electrode.

The method may further include, after forming the aluminum layer, cooling a high-temperature state due to the argon plasma surface treatment and formation of the aluminum layer to a predetermined temperature or less.

The predetermined temperature or a deposition process temperature of the AlScN material may be in a range of 280[° C.] or more and 320[° C.] or less.

In the piezoelectric layer, a composition ratio of the AlScN material may be $Al_{1-X}Sc_XN$, and X may be 0.05 or more and 0.43 or less.

In another general aspect, there is provided a BAW resonator including: a substrate; a lower electrode formed above the substrate; a piezoelectric layer formed above the lower electrode; and an upper electrode formed above the piezoelectric layer, wherein the lower electrode has a nitrogen layer formed by plasma surface treatment, the piezoelectric layer is present in a form that includes at least scandium (Sc) above the formed nitrogen layer, and an upper surface of the piezoelectric layer is aligned to an N polarity.

Contamination may be removed from an upper surface of the lower electrode through argon (Ar) plasma surface treatment.

The piezoelectric layer may consist of AlScN including scandium, a composition ratio of the AlScN material may be $Al_{1-x}Sc_xN$, and X may be 0.05 or more and 0.43 or less.

In another general aspect, there is provided a BAW resonator including: a substrate; a lower electrode formed above the substrate; a piezoelectric layer formed above the lower electrode; and an upper electrode formed above the piezoelectric layer, wherein the lower electrode has an aluminum layer formed on an upper surface thereof, the piezoelectric layer is formed above the formed aluminum layer, and an upper surface of the piezoelectric layer is aligned to an Al polarity.

Contamination may be removed from the upper surface of the lower electrode through argon (Ar) plasma surface treatment.

The piezoelectric layer may consist of AlScN including scandium, a composition ratio of the AlScN material may be $Al_{1-X}Sc_XN$, and X may be 0.05 or more and 0.43 or less.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, exemplary embodiments of the present invention will be described in detail with reference to the attached drawings.

The embodiments of the present invention are provided to more completely explain the present invention to one of ordinary skill in the art. The following embodiments may be modified in a variety of different forms, and the scope of the present invention is not limited thereto. The embodiments are provided to make the disclosure more substantial and complete and to completely convey the concept of the present invention to those skilled in the art.

The terms used herein are to explain particular embodiments and are not intended to limit the present invention. As used herein, singular forms, unless contextually defined otherwise, may include plural forms. Also, as used herein, the term "and/or" includes any and all combinations or one of a plurality of associated listed items. Hereinafter, the embodiments of the present invention will be described with reference to the drawings which schematically illustrate the embodiments.

Figure 1:
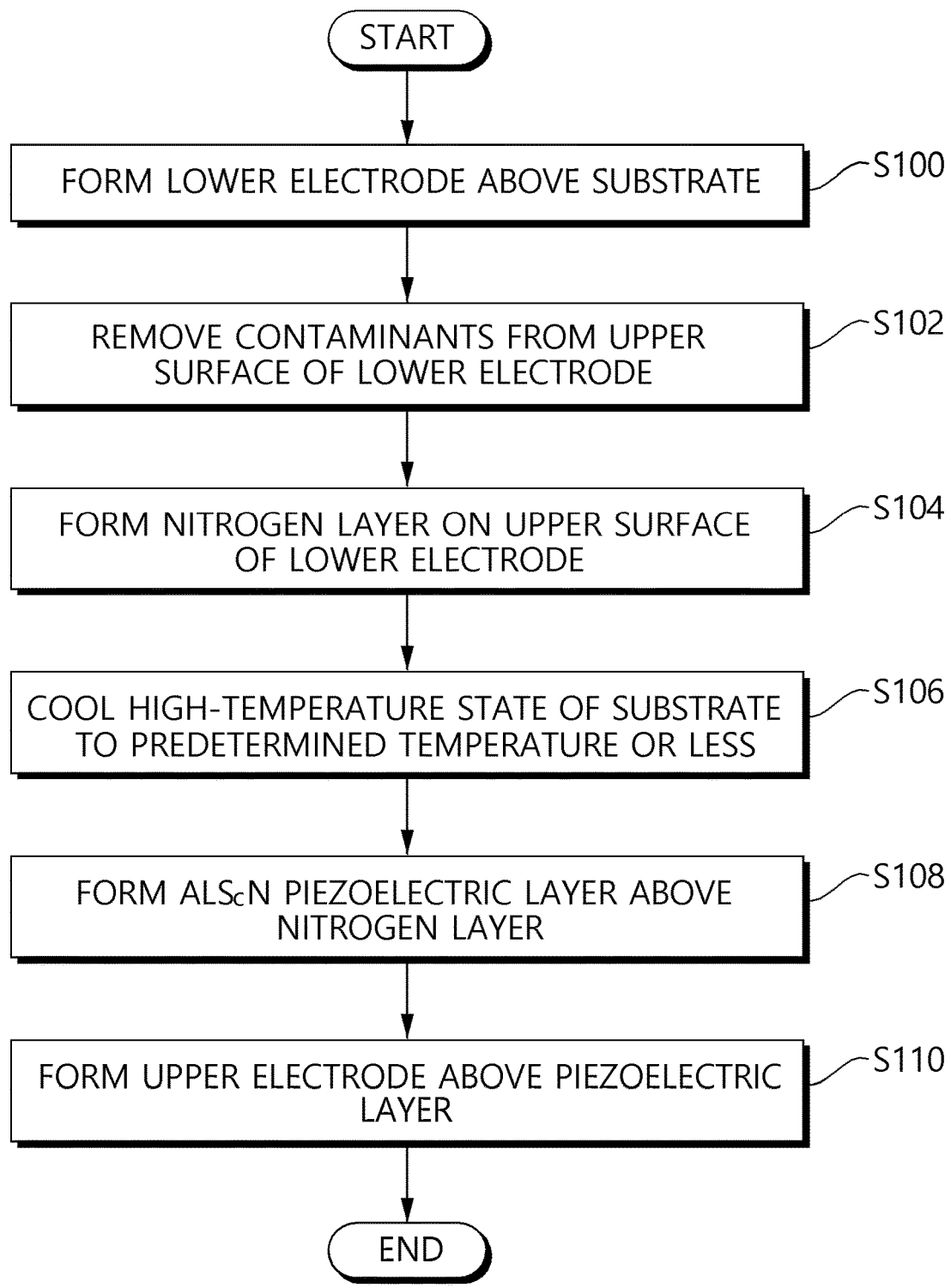
FIG. 1 is a flowchart illustrating a method of manufacturing a bulk acoustic wave (BAW) resonator according to an embodiment of the present invention.
Figure 2:
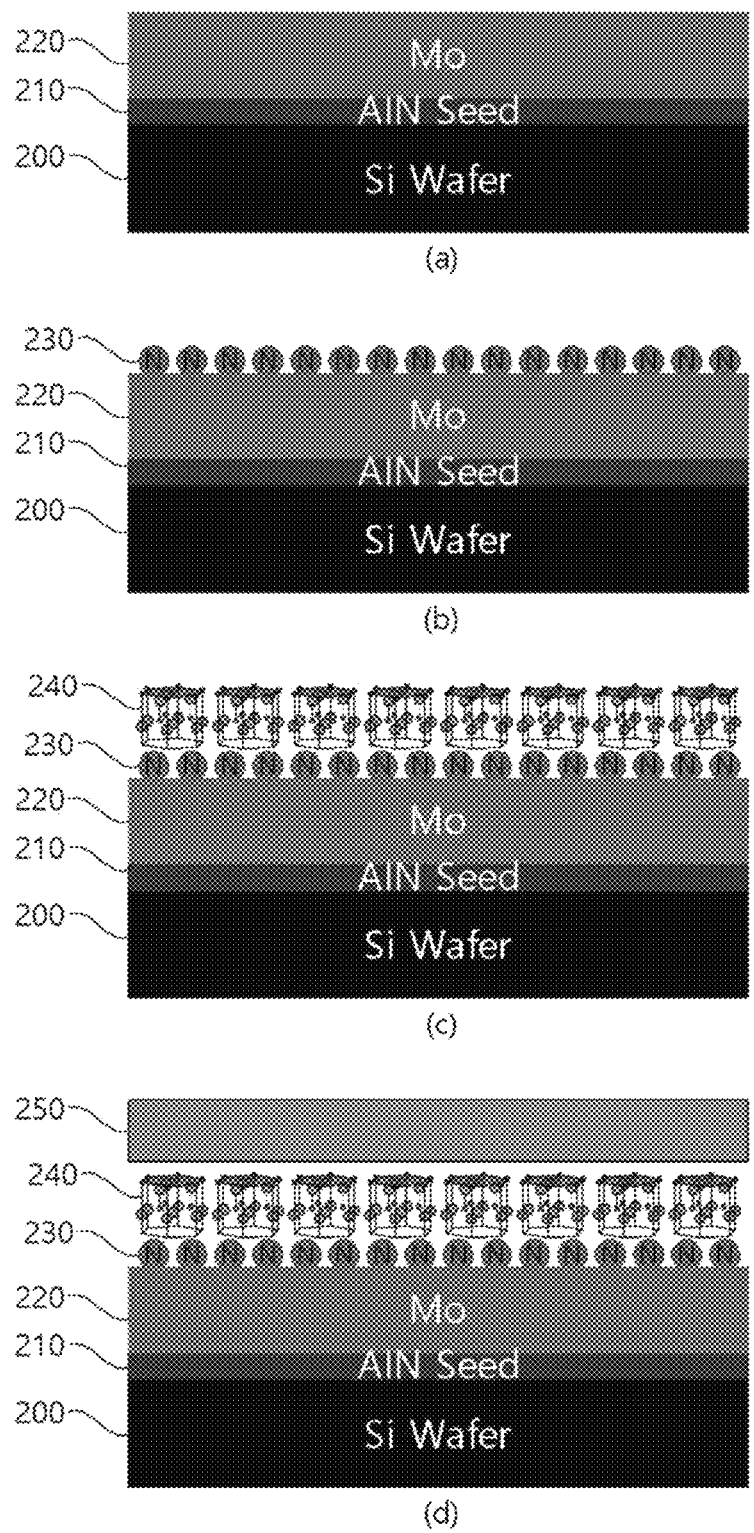
FIG. 2 is a reference diagram illustrating a manufacturing process for the method of manufacturing a BAW resonator of FIG. 1.

FIG. 1 is a flowchart illustrating a method of manufacturing a bulk acoustic wave (BAW) resonator according to the present invention, and FIG. 2 is a reference diagram illustrating a manufacturing process for the method of manufacturing a BAW resonator of FIG. 1. A BAW resonator includes a film bulk acoustic resonator (FBAR), a solidly mounted resonator (SMR), or the like.

First, to manufacture the BAW resonator, a lower electrode is formed above a substrate in operation S100. Referring to (a) of FIG. 2, a seed layer 210 is formed above a substrate 200 and a lower electrode 220 is formed above the seed layer 210.

When a signal is applied between the lower electrode and an upper electrode, which are formed above the substrate, the BAW resonator resonates with respect to a frequency of natural oscillation according to a thickness of a piezoelectric layer while part of electrical energy input and transferred between the two electrodes is converted into mechanical energy according to a piezoelectric effect and is converted again into electrical energy.

To manufacture the BAW resonator, the substrate may be a semiconductor substrate and may employ a general silicon wafer. Preferably, a high resistivity silicon substrate (HRS) may be used. A cavity may be formed above the substrate. After the cavity is formed in the substrate 100, an insulation layer is formed on the cavity, a sacrificial layer is deposited above the insulation layer, the sacrificial layer above the insulation layer is planarized through etching, and the sacrificial layer is removed.

The lower electrode formed on the substrate is formed by depositing a predetermined material above the substrate and patterning the deposited material. A material used for the lower electrode includes a general conductive material such as a metal, and preferably, may include one of aluminum (Al), tungsten (W), gold (Au), platinum (Pt), nickel (Ni), titanium (Ti), tantalum (Ta), iridium (Ir), chrome (Cr), palladium (Pd), vanadium (V), copper (Cu), titanium nitride (TiN), molybdenum (Mo), an alloy or a laminate of two or more thereof.

Meanwhile, the seed layer may be formed before the lower electrode is formed above the substrate. The seed layer may consist of any one or more of AlN, Ti, Ni, W, TiW, TiN, and titanium oxide (TiOx), or an alloy thereof.

After operation S100, contaminants are removed from an upper surface of the lower electrode through argon (Ar) plasma surface treatment on the lower electrode in operation S102. The surface on which the lower electrode has been formed may be stained with various contaminants (e.g., particulate matter, metal particles, etc.). To remove such contaminants, argon (Ar) surface treatment is performed on the surface of the lower electrode. Since argon plasma is an ionized gas, it has advantages in that a solvent is not required, a surface-treated depth is shallow, and the surface treatment can be performed at once.

Since argon is an inert gas, the argon plasma removes contaminants through sputtering by momentum exchange due to collision of argon atoms and argon ions (Ar+) in plasma with molecular components of the contaminants, without relying on oxidative etching.

Table 1 below illustrates process conditions for argon (Ar) plasma surface treatment.

TABLE 1

| Plasma Treatment | Middle Freq. [W] | DC Current [A] | RF [W] | Ar [sccm] | $N_2$ [sccm] | Time [sec] |
|---|---|---|---|---|---|---|
| Ar plasma treatment | 200~400 | 15~20 | 5~40 | 5~20 | 0 | 5~300 |

The argon plasma surface treatment may effectively remove contaminants attached to the surface of the lower electrode while minimizing damage to the surface of the lower electrode.

The above-described process may be performed in a separate chamber, and also in a chamber in which AlScN is deposited. However, the argon plasma surface treatment process may be omitted as required.

After operation S102, a nitrogen layer is formed on the upper surface of the lower electrode through nitrogen ($N_2$) plasma surface treatment in operation S104. As shown in (b) of FIG. 2, nitrogen ($N_2$) is adsorbed on the lower electrode 220 through nitrogen plasma surface treatment to form a nitrogen layer 230.

The nitrogen plasma treatment time may be changed to, for example, 20 [s], 30 [s], 60 [s], 3 [min], 5 [min], or the like. Also, the discharge power (middle freq. power (W) in Table 1) may be changed to, for example, 200 [W], 250 [W], 300 [W], 350 [W], 400 [W], or the like, and the RF power (RF power (W) in Table 1) may be changed to, for example, 5 [W], 10 [W], 15 [W], 20 [W], 25 [W], 30 [W], 40 [W], or the like. As the RF power for nitrogen plasma surface treatment increases, nitrogen electrons with higher energy are formed above the lower electrode. However, if the RF power is too high, it may provide sufficient power to insert nitrogen into the lower electrode, but may cause damage to the surface of the lower electrode due to high plasma energy. Thus, it is required to apply an appropriate RF power.

Table 2 below illustrates process conditions for nitrogen (N2) plasma surface treatment.

TABLE 2

| Plasma Treatment | Middle Freq. [W] | DC Current [A] | RF [W] | Ar [sccm] | $N_2$ [sccm] | Time [sec] |
|---|---|---|---|---|---|---|
| $N_2$ plasma treatment | 50~400 | 15~20 | 5~40 | 0~20 | 0~20 | 5~300 |

After operation S104, a high-temperature state of the substrate due to the argon plasma surface treatment and formation of the nitrogen layer is cooled down to a predetermined temperature or less in operation S106. Here, the predetermined temperature to which the temperature raised due to the argon plasma surface treatment and the nitrogen plasma surface treatment is to be cooled, or a deposition process temperature of the AlScN material, may be 280[° C.]

or more and 320[° C.] or less. For example, after the substrate is cooled in an in-situ cooling chamber and transferred to a deposition chamber, a cooling gas of the cooling chamber includes $N_2$, Ar, and the like at room temperature. The cooling time in the cooling chamber may vary to, for example, 60 to 240 [s] depending on circumstances. Argon (Ar) 2 mBar condition of the process, 120 [sec], may be applied. However, the process of cooling the high-temperature state of the substrate is not an essential process, and the process may be omitted as required.

After operation S106, a piezoelectric layer made of an AlScN material is formed above the nitrogen layer and an upper surface of the piezoelectric layer is aligned to an N polarity in operation S108.

As shown in (c) of FIG. 2, a piezoelectric layer 240 made of an AlScN material is formed above the nitrogen layer 230, so that an upper surface of the piezoelectric layer 240 may be aligned to an N polarity.

Figure 3:
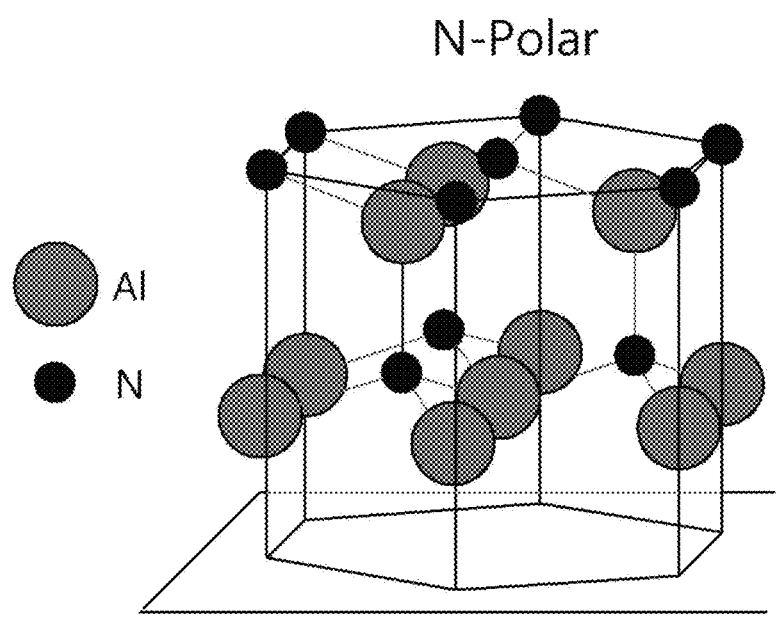
FIG. 3 is a reference diagram illustrating an example of the unit cell arrangement of a piezoelectric layer when the piezoelectric layer made of an AlScN material is formed above a nitrogen layer.

FIG. 3 is a reference diagram illustrating an example of the unit cell arrangement of the piezoelectric layer 240 when the piezoelectric layer 240 made of an AlScN material is formed above the nitrogen layer 230. Referring to FIG. 3, the arrangement of aluminum (Al) components and nitrogen (N) components in the unit cell arrangement constituting the piezoelectric layer 240 is illustrated. It can be seen that, under the influence of the lower nitrogen layer 230, an AlScN unit-cell is grown and aligned to the N polarity and a film deposited thereafter grows along the N polarity.

The piezoelectric layer may be formed by depositing a piezoelectric material above the lower electrode with the nitrogen layer formed thereon and then patterning the deposited material. As a general piezoelectric material, aluminum nitride (AlN), or aluminum scandium nitride (AlScN) may be used. As for the deposition method, pulse-DC magnetron sputtering, RF magnetron sputtering, and the like are used.

In this case, in the piezoelectric layer, a composition ratio of the AlScN material may be $Al_{1-x}Sc_xN$, and X may be 0.05 or more and 0.43 or less. Materials for doping may include one or two or more selected from among scandium (Sc), yttrium (Y), lanthanum (La), cerium (Ce), praseodymium (Pr), neodymium (Nd), promethium (Pm), samarium (Sm), europium (Eu)), gadolinium (Gd), terbium (Tb), dysprosium (Dy), holmium (Ho), erbium (Er), thulium (Tm), ytterbium (Yb), lutetium (Lu), and the like. The total composition ratio of a dopant does not exceed 50%.

After operation S108, an upper electrode is formed above the piezoelectric layer aligned to the N polarity in operation S110. The upper electrode may be formed by depositing a metal film for an upper electrode above the piezoelectric layer and patterning the metal film. The upper electrode and the lower electrode may be the same material or different materials, and may be formed by the same deposition method and patterning method.

Figure 4:
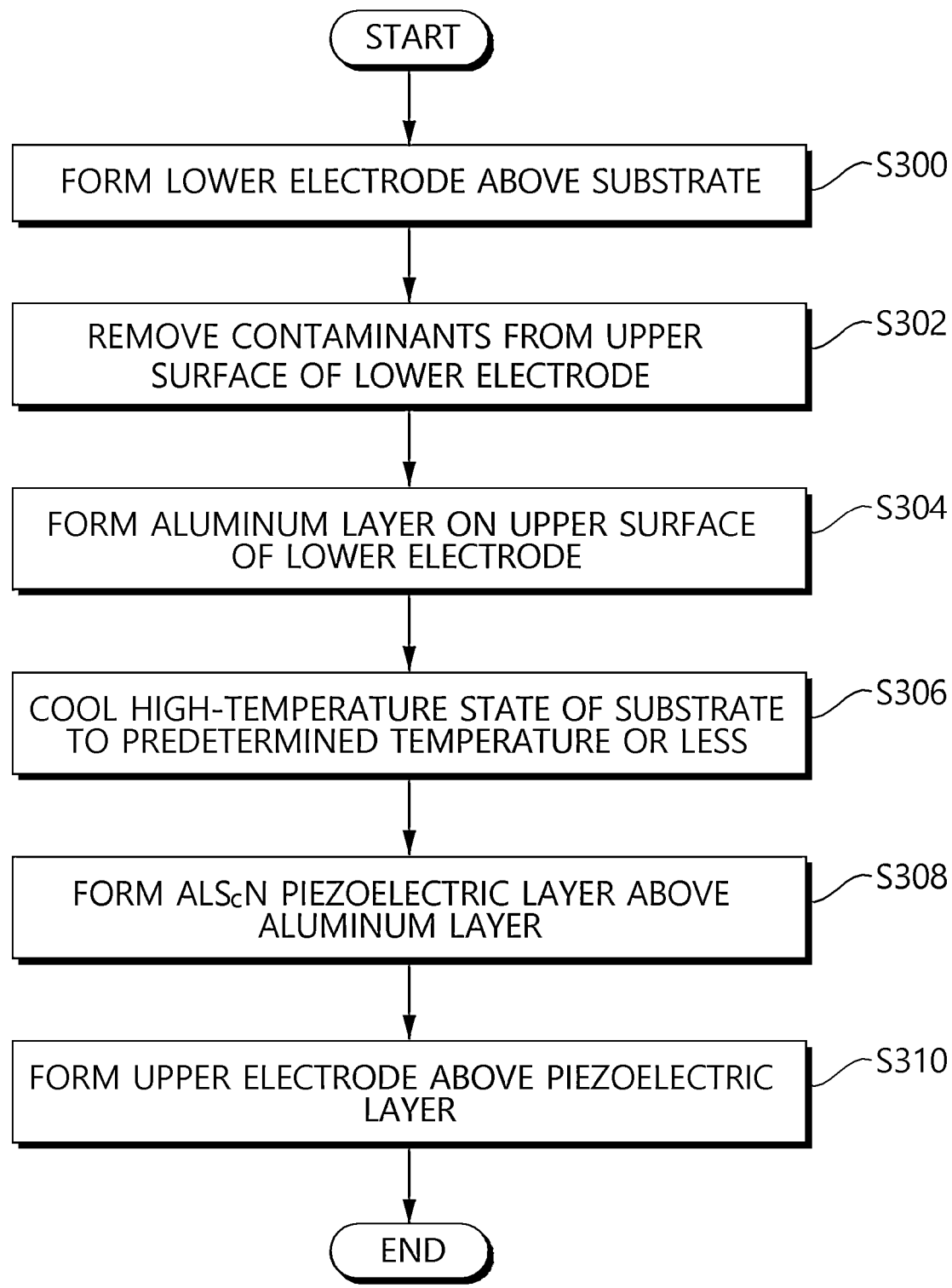
FIG. 4 is a flowchart illustrating a method of manufacturing a BAW resonator according to another embodiment of the present invention.
Figure 5:
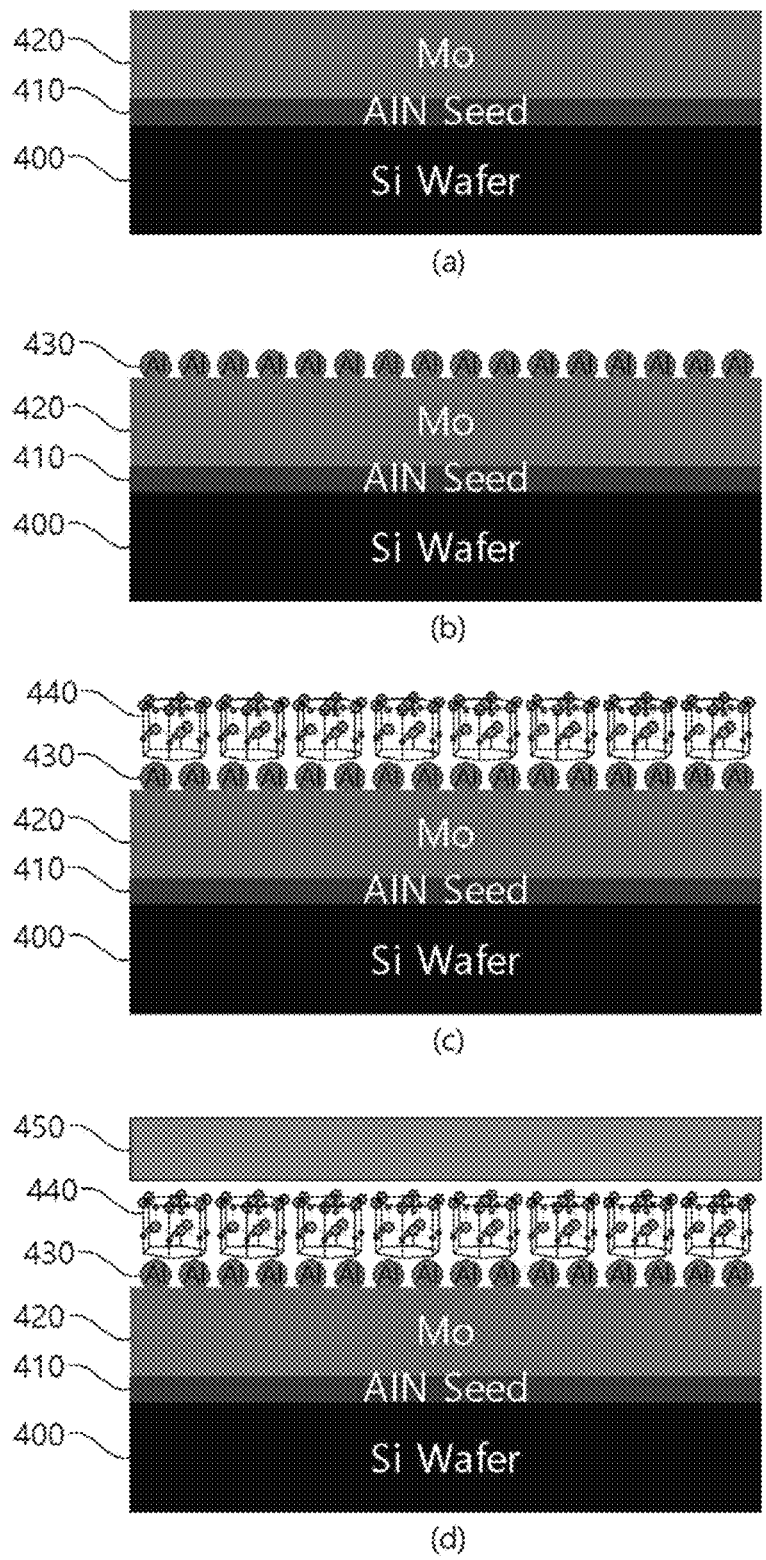
FIG. 5 is a reference diagram illustrating a manufacturing process for the method of manufacturing a BAW resonator of FIG. 4.

FIG. 4 is a flowchart illustrating a method of manufacturing a BAW resonator according to another embodiment of the present invention, and FIG. 5 is a reference diagram illustrating a manufacturing process for the method of manufacturing a BAW resonator of FIG. 4.

First, to manufacture a FBAR resonator, a lower electrode is formed above a substrate in operation S300. Referring to (a) of FIG. 5, a seed layer 410 is formed above a substrate 400 and a lower electrode 420 is formed above the seed layer 410. To manufacture the FBAR resonator, the substrate may be a semiconductor substrate and may employ a general silicon wafer. Preferably, a high resistivity silicon substrate (HRS) may be used.

The seed layer 410 may be formed before the lower electrode is formed above the substrate. The seed layer 410 may consist of any one or more of AlN, Ti, Ni, W, TiW, TiN, and titanium oxide (TiOx), or an alloy thereof.

The lower electrode 420 formed on the substrate is formed by depositing a predetermined material above the substrate and patterning the deposited material. A material used for the lower electrode 420 includes a general conductive material such as a metal, and preferably, may include one of aluminum (Al), tungsten (W), gold (Au), platinum (Pt), nickel (Ni), titanium (Ti), tantalum (Ta), iridium (Ir), chrome (Cr), palladium (Pd), vanadium (V), copper (Cu), titanium nitride (TiN), molybdenum (Mo), an alloy or a laminate of two or more thereof.

After operation S300, contaminants are removed from an upper surface of the lower electrode through argon (Ar) plasma surface treatment on the lower electrode in operation S302. Since an argon plasma is an ionized gas, it has advantages in that a solvent is not required, a surface-treated depth is shallow, and the surface treatment can be performed at once. The argon plasma surface treatment may effectively remove contaminants attached to the surface of the lower electrode while minimizing damage to the surface of the lower electrode.

After operation S302, an aluminum (Al) layer is formed on an upper surface of the lower electrode in operation S304. The aluminum layer 430 may be formed through sputtering, evaporation, or the like. The aluminum layer 430 is required to be deposited without exposure to air, and when the aluminum layer 430 is exposed to air, a process of removing aluminum oxide, such as argon (Ar) plasma surface treatment, must be essentially added.

After operation S304, high temperature of the substrate due to the argon plasma surface treatment and formation of the aluminum layer is cooled down to a predetermined temperature or less in operation S306. Here, the predetermined temperature to which the temperature raised due to the argon plasma surface treatment and formation of the aluminum layer is to be cooled, or a deposition process temperature of the AlScN material, may be 280[° C.] or more and 320[° C.] or less. However, the process of cooling the high-temperature state of the substrate is not an essential process, and the process may be omitted as required.

After operation S306, a piezoelectric layer made of an AlScN material is formed above the aluminum layer and an upper surface of the piezoelectric layer is aligned to an Al polarity in operation S308.

As shown in (c) of FIG. 5, a piezoelectric layer 440 made of an AlScN material is formed above the aluminum layer 430, so that an upper surface of the piezoelectric layer 440 may be aligned to an Al polarity.

Figure 6:
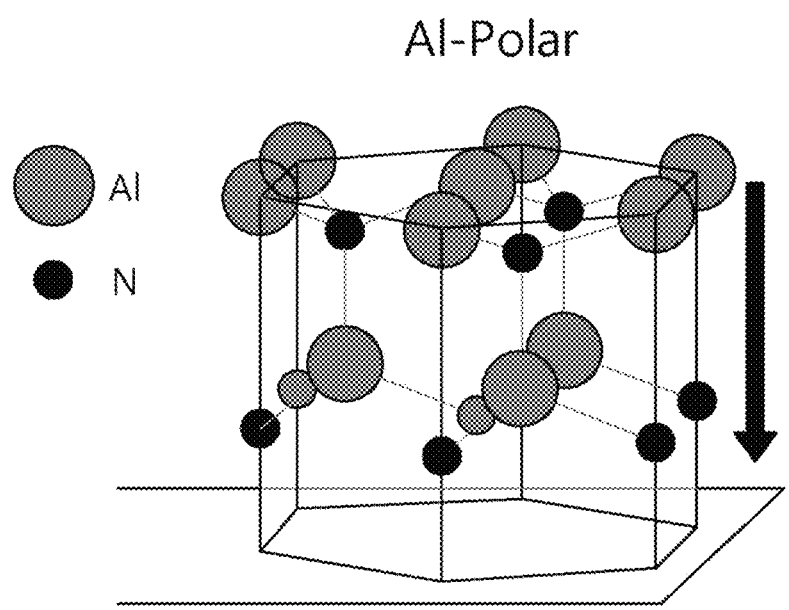
FIG. 6 is a reference diagram illustrating an example of the unit cell arrangement of a piezoelectric layer when the piezoelectric layer made of an AlScN material is formed above an aluminum layer.

FIG. 6 is a reference diagram illustrating an example of the unit cell arrangement of the piezoelectric layer 440 when the piezoelectric layer 440 made of an AlScN material is formed above the aluminum layer 430. Referring to FIG. 6, the arrangement of aluminum (Al) components and nitrogen (N) components in the unit cell arrangement constituting the piezoelectric layer 440 is illustrated. It can be seen that, under the influence of the aluminum layer 430, an AlScN unit-cell is grown and aligned to the Al polarity and a film deposited thereafter grows along the Al polarity.

The piezoelectric layer may be formed by depositing a piezoelectric material above the lower electrode with the aluminum layer formed thereon and then patterning the deposited material. As a general piezoelectric material, aluminum nitride (AlN), or aluminum scandium nitride (AlScN) may be used. As for the deposition method, pulse-DC magnetron sputtering, RF magnetron sputtering, and the like are used.

In this case, in the piezoelectric layer, a composition ratio of the AlScN material may be $Al_{1-x}Sc_xN$, and X may be 0.05 or more and 0.43 or less. Materials for doping may include one or two or more selected from among scandium (Sc), yttrium (Y), lanthanum (La), cerium (Ce), praseodymium (Pr), neodymium (Nd), promethium (Pm), samarium (Sm), europium (Eu)), gadolinium (Gd), terbium (Tb), dysprosium (Dy), holmium (Ho), erbium (Er), thulium (Tm), ytterbium (Yb), lutetium (Lu), and the like.

After operation S308, an upper electrode is formed above the piezoelectric layer aligned to the Al polarity in operation S310. The upper electrode may be formed by depositing a metal film for an upper electrode above the piezoelectric layer and patterning the metal film. The upper electrode and the lower electrode may be the same material or different materials, and may be formed by the same deposition method and patterning method.

Figure 7:
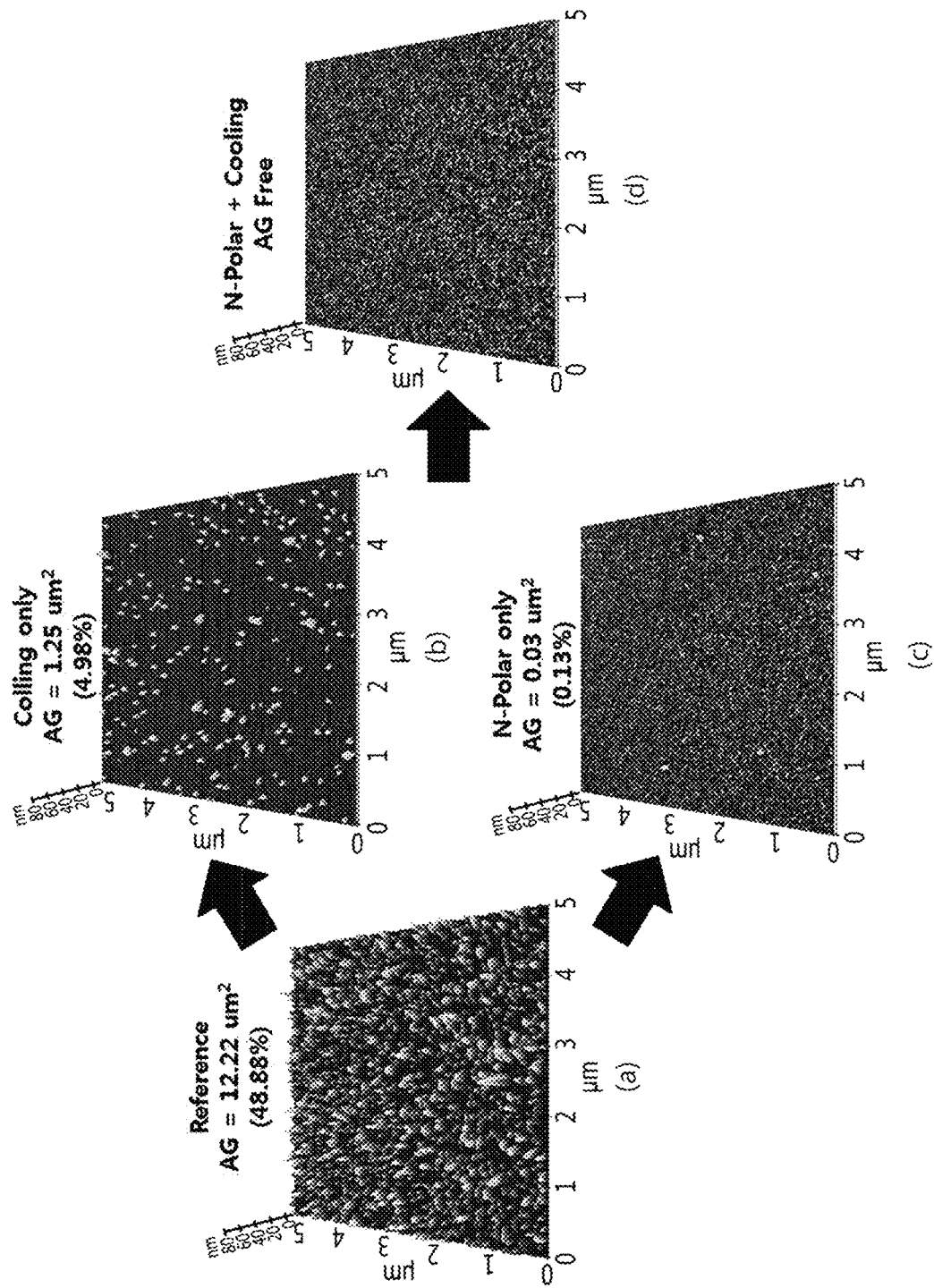
FIG. 7 is an exemplary embodiment illustrating abnormal growth control according to surface treatment before formation of a piezoelectric layer made of an $Al_{0.7}Sc_{0.3}N$ material.

FIG. 7 is an exemplary embodiment illustrating abnormal growth control according to surface treatment before formation of a piezoelectric layer made of an Al0.7Sc0.3N material.

Referring to FIG. 7, (a) of FIG. 7 illustrates abnormal growth of an $Al_{0.7}Sc_{0.3}N$ film formed by a conventional process method, (b) of FIG. 7 illustrates abnormal growth of an $Al_{0.7}Sc_{0.3}N$ film formed by a process method omitting operation S106 of FIG. 1, (c) of FIG. 7 illustrates abnormal growth of an $Al_{0.7}Sc_{0.3}N$ film formed by a process method omitting operation S106 of FIG. 1, and (d) of FIG. 7 illustrates a surface of an $Al_{0.7}Sc_{0.3}N$ film without any abnormal growth when surface treatment is performed according to the process sequences shown in FIG. 1.

In an FBAR according to the manufacturing method as described above, a nitrogen layer may be formed on a surface of a lower electrode through nitrogen (N2) plasma surface treatment or an aluminum layer may be formed through sputtering, so that alignment to an N polarity or Al polarity can occur above a piezoelectric layer made of AlScN formed above the nitrogen layer or aluminum layer, and thereby abnormal growth of the AlScN material may be suppressed.

According to the present invention, a nitrogen layer is formed on the lower electrode through nitrogen (N2) plasma surface treatment, a high-temperature state due to argon plasma surface treatment and formation of the nitrogen layer is cooled to a predetermined temperature or less and then a piezoelectric layer and an upper electrode are formed, so that alignment to an N polarity can occur above the piezoelectric layer made of an AlScN material formed above the nitrogen layer and accordingly abnormal growth of the AlScN material can be suppressed. Also, since the abnormal growth of the AlScN material can be suppressed, it is possible to manufacture a BAW resonator having a wide bandwidth and high $k^2_{eff}$ and quality coefficient values.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed:

1. A method of manufacturing a bulk acoustic wave (BAW) resonator, comprising:
   forming a lower electrode above a substrate;
   forming a nitrogen layer on an upper surface of the lower electrode through nitrogen ($N_2$) plasma surface treatment;
   forming a piezoelectric layer made of an AlScN material above the nitrogen layer to align an upper surface of the piezoelectric layer to an N polarity; and
   forming an upper electrode above the piezoelectric layer aligned to the N polarity.

2. The method of claim 1, further comprising, after forming the lower electrode, removing contaminants from the upper surface of the lower electrode through argon (Ar) plasma surface treatment on the lower electrode.

3. The method of claim 1, further comprising, after forming the nitrogen layer, cooling a high-temperature state due to the argon plasma surface treatment and formation of the nitrogen layer to a predetermined temperature or less.

4. The method of claim 3, wherein the predetermined temperature or a deposition process temperature of the AlScN material is 280[° C.] or more and 320[° C.] or less.

5. The method of claim 1, wherein in the piezoelectric layer, a composition ratio of the AlScN material is $Al_{1-x}Sc_xN$, and X is 0.05 or more and 0.43 or less.

6. A method of manufacturing a bulk acoustic wave (BAW) resonator, comprising:
   forming a lower electrode above a substrate;
   forming an aluminum layer on an upper surface of the lower electrode;
   forming a piezoelectric layer made of an AlScN material above the aluminum layer to align an upper surface of the piezoelectric layer to an Al polarity; and
   forming an upper electrode above the piezoelectric layer aligned to the Al polarity.

7. The method of claim 6, further comprising, after forming the lower electrode, removing contaminants from the upper surface of the lower electrode through argon (Ar) plasma surface treatment on the lower electrode.

8. The method of claim 6, further comprising, after forming the aluminum layer, cooling a high-temperature state due to the argon plasma surface treatment and formation of the aluminum layer to a predetermined temperature or less.

9. The method of claim 8, wherein the predetermined temperature or a deposition process temperature of the AlScN material is in a range of 280[° C.] or more and 320[° C.] or less.

10. The method of claim 6, wherein in the piezoelectric layer, a composition ratio of the AlScN material is $Al_{1-x}Sc_xN$, and X is 0.05 or more and 0.43 or less.

11. A bulk acoustic wave (BAW) resonator comprising:
   a substrate;
   a lower electrode formed above the substrate;
   a piezoelectric layer formed above the lower electrode; and
   an upper electrode formed above the piezoelectric layer, wherein:
   the lower electrode has a nitrogen layer formed by plasma surface treatment,
   the piezoelectric layer is present in a form that includes at least scandium (Sc) above the formed nitrogen layer, and
   an upper surface of the piezoelectric layer is aligned to an N polarity.

12. The BAW resonator of claim 11, wherein contamination is removed from an upper surface of the lower electrode through argon (Ar) plasma surface treatment.

13. The BAW resonator of claim 11, wherein the piezoelectric layer consists of AlScN including scandium, a composition ratio of the AlScN material is $Al_{1-x}Sc_xN$, and X is 0.05 or more and 0.43 or less.

14. A bulk acoustic wave (BAW) resonator comprising:
a substrate;
a lower electrode formed above the substrate;
a piezoelectric layer formed above the lower electrode; and
an upper electrode formed above the piezoelectric layer, wherein:
the lower electrode has an aluminum layer formed on an upper surface thereof,
the piezoelectric layer is formed above the formed aluminum layer, and
an upper surface of the piezoelectric layer is aligned to an Al polarity.

15. The BAW resonator of claim 14, wherein contamination is removed from the upper surface of the lower electrode through argon (Ar) plasma surface treatment.

16. The BAW resonator of claim 14, wherein the piezoelectric layer consists of AlScN including scandium, a composition ratio of the AlScN material is $Al_{1-x}Sc_xN$, and X is 0.05 or more and 0.43 or less.

* * * * *